United States Patent
Okabe et al.

(10) Patent No.: US 11,069,512 B2
(45) Date of Patent: Jul. 20, 2021

(54) FILM FORMING APPARATUS AND GAS INJECTION MEMBER USED THEREFOR

(71) Applicant: TOKYO ELECTRON LIMITED, Tokyo (JP)

(72) Inventors: Shinya Okabe, Yamanashi (JP); Takashi Mochizuki, Yamanashi (JP); Hideaki Yamasaki, Yamanashi (JP); Nagayasu Hiramatsu, Yamanashi (JP); Kazuki Dempoh, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 244 days.

(21) Appl. No.: 15/671,906

(22) Filed: Aug. 8, 2017

(65) Prior Publication Data
US 2018/0047541 A1    Feb. 15, 2018

(30) Foreign Application Priority Data
Aug. 12, 2016  (JP) .............................. JP2016-158706

(51) Int. Cl.
*H01J 37/32*    (2006.01)
*C23C 16/455*   (2006.01)
(Continued)

(52) U.S. Cl.
CPC ........ *H01J 37/3244* (2013.01); *C23C 16/045* (2013.01); *C23C 16/06* (2013.01); (Continued)

(58) Field of Classification Search
CPC ............. H01J 37/3244; H01J 37/32724; H01J 2237/327; H01J 2237/3323;
(Continued)

(56) References Cited

U.S. PATENT DOCUMENTS

| 8,591,655 B2 * | 11/2013 | Masuda .................. C30B 25/14 118/715 |
| 2013/0078789 A1 * | 3/2013 | Nakayama ............ H01L 21/223 438/513 |
| 2015/0247237 A1 * | 9/2015 | Ha .................... C23C 16/45565 118/715 |

FOREIGN PATENT DOCUMENTS

| CN | 1777694 A | 5/2006 |
| CN | 102089867 A | 6/2011 |

(Continued)

*Primary Examiner* — Rudy Zervigon
(74) *Attorney, Agent, or Firm* — Fenwick & West LLP

(57) ABSTRACT

A film forming apparatus, for forming a film on a target substrate using a processing gas excited by plasma, includes: a processing chamber for accommodating the substrate; a mounting table for mounting thereon the substrate in the processing chamber; a gas injection member provided to face the substrate mounted on the mounting table and configured to inject the processing gas toward the target substrate on the mounting table; and a plasma generation unit for exciting the processing gas by generating plasma between the gas injection member and the mounting table. The gas injection member has a gas injection surface facing the mounting table. Gas injection holes are formed in the gas injection surface. A gas injection hole forming region, on the gas injection surface, where the gas injection holes are formed is smaller than a region on the gas injection surface which corresponds to the target substrate.

10 Claims, 16 Drawing Sheets

(51) Int. Cl.
    *C23C 16/04*     (2006.01)
    *C23C 16/34*     (2006.01)
    *C23C 16/509*     (2006.01)
    *C23C 16/14*     (2006.01)
    *C23C 16/56*     (2006.01)
    *H01L 21/768*     (2006.01)
    *C23C 16/06*     (2006.01)
    *C23C 16/458*     (2006.01)
    *C23C 16/46*     (2006.01)
    *C23C 16/50*     (2006.01)
    *H01L 21/285*     (2006.01)

(52) U.S. Cl.
    CPC .............. *C23C 16/14* (2013.01); *C23C 16/34* (2013.01); *C23C 16/458* (2013.01); *C23C 16/45565* (2013.01); *C23C 16/46* (2013.01); *C23C 16/50* (2013.01); *C23C 16/5096* (2013.01); *C23C 16/56* (2013.01); *H01J 37/32724* (2013.01); *H01L 21/28556* (2013.01); *H01L 21/28568* (2013.01); *H01L 21/76843* (2013.01); *H01J 2237/327* (2013.01); *H01J 2237/3321* (2013.01); *H01J 2237/3323* (2013.01); *H01L 21/28518* (2013.01); *H01L 21/76856* (2013.01)

(58) Field of Classification Search
    CPC ....... H01J 2237/3321; H01L 21/76843; H01L 21/28568; H01L 21/28556; H01L 21/76856; H01L 21/28518; C23C 16/56; C23C 16/45565; C23C 16/34; C23C 16/14; C23C 16/045; C23C 16/5096; C23C 16/06; C23C 16/50; C23C 16/46; C23C 16/458
    USPC ........................ 118/715; 156/345.33, 345.34
    See application file for complete search history.

(56) References Cited

FOREIGN PATENT DOCUMENTS

| | | |
|---|---|---|
| JP | H07-307334 A | 11/1995 |
| JP | 2008-274343 A | 11/2008 |
| JP | 2010-021446 A | 1/2010 |
| JP | 2013-048227 A | 3/2013 |
| JP | 2015-124397 A | 7/2015 |
| KR | 2006-0091006 A | 8/2006 |
| KR | 2011-0018431 A | 2/2011 |
| WO | 2004050948 A1 | 6/2004 |
| WO | 2010004997 A1 | 1/2010 |

\* cited by examiner

<CONVENTIONAL SHOWER HEAD>

<NARROW SHOWER HEAD (EMBODIMENT)>

FILM FORMING APPARATUS AND GAS INJECTION MEMBER USED THEREFOR

CROSS-REFERENCE TO RELATED APPLICATIONS

This application claims priority to Japanese Patent Application No. 2016-158706 filed on Aug. 12, 2016, the entire contents of which is incorporated herein by reference.

FIELD OF THE INVENTION

The disclosure relates to a film forming apparatus and a gas injection member used therefor.

BACKGROUND OF THE INVENTION

As for a technique for forming a thin film on a substrate such as a semiconductor wafer or the like, there is known a chemical vapor deposition (CVD) technique. As for a film forming apparatus for forming a film by CVD, there is known an apparatus for injecting a processing gas through a plurality of gas injection holes formed in a gas injection surface of a shower head provided, above a mounting table for mounting thereon a substrate, to face the substrate, the shower head serving as a gas injection member for injecting a processing gas.

In this film forming apparatus, a size of a gas injection hole forming region, on the gas injection surface of the shower head, where the gas injection holes are formed is generally greater than or equal to a region corresponding to the substrate on the mounting table in view of uniform supply of a processing gas to the substrate (see, e.g., Japanese Patent Application Publication No. 2013-48227).

In Japanese Patent Application Publication No. 2013-48227, the size of the gas injection hole forming region on the gas injection surface of the shower head is set to be greater than or equal to the region corresponding to the substrate on the mounting table and a diameter of the gas injection holes and arrangement of the gas injection holes are studied to improve in-plane uniformity of a film thickness.

As for the CVD, there is known plasma CVD for assisting dissociation of a processing gas by exciting the processing gas by using a plasma. However, in the plasma CVD, a film thickness at an outer peripheral portion of the substrate may become thin. Therefore, in order to improve in-plane uniformity of the film thickness, it is required to control the film thickness at the outer peripheral portion of the substrate.

However, in the plasma CVD, it is difficult to control the film thickness at the outer peripheral portion of the substrate even if the diameter of the gas injection holes and the arrangement of the gas injection holes are studied. Accordingly, it is difficult to obtain desired in-plane uniformity of the film thickness.

SUMMARY OF THE INVENTION

In view of the above, the disclosure provides a technique capable of obtaining desired in-plane uniformity of a film thickness by controlling a film thickness at an outer peripheral portion of a substrate in the case of forming a film by using plasma CVD.

In accordance with an aspect, there is provided a film forming apparatus for forming a film on a target substrate using a processing gas excited by plasma. The film forming apparatus includes: a processing chamber configured to accommodate the target substrate; a mounting table configured to mount thereon the target substrate in the processing chamber; a gas injection member provided to face the target substrate mounted on the mounting table and configured to inject the processing gas toward the target substrate on the mounting table; and a plasma generation unit configured to excite the processing gas by generating plasma between the gas injection member and the mounting table. The gas injection member has a gas injection surface facing the mounting table, a plurality of gas injection holes is formed in the gas injection surface, and a gas injection hole forming region, on the gas injection surface, where the gas injection holes are formed is smaller than a region on the gas injection surface which corresponds to the target substrate.

In accordance with another aspect, there is provided a gas injection member, which is provided to face a target substrate mounted on a mounting table in a processing chamber, for injecting a processing gas to the target substrate on the mounting table to form a film on the target substrate by the processing gas in a state where a plasma is generated between the mounting table and the gas injection member. The gas injection member includes: a gas injection surface which faces the mounting table, a plurality of gas injection holes formed in the gas injection surface, and a gas injection hole forming region, on the gas injection surface, where the gas injection holes are formed. The gas injection hole forming region is smaller than a region on the gas injection surface which corresponds to the target substrate.

With such configuration, the gas injection member is configured in such a manner that the gas injection forming region on the gas injection surface where the gas injection holes are formed is smaller than the region on the gas injection surface which corresponds to the target substrate. Therefore, it is possible to increase the concentration of active species at the outer peripheral portion of the target substrate and also possible to obtain desired in-plane uniformity of the film thickness by controlling the film thickness at the outer peripheral portion of the target substrate.

BRIEF DESCRIPTION OF THE DRAWINGS

The objects and features of the disclosure will become apparent from the following description of embodiments, given in conjunction with the accompanying drawings, in which:

FIGS. 7A and 7B show relation between film formation time and film thicknesses at a center and an outer periphery of a wafer W and an average film thickness in the case of forming a Ti film by using the conventional shower head, wherein FIG. 7A shows a result on an $SiO_2$ film and FIG. 7B shows a result on an Si substrate;

FIGS. 8A and 8B show film thickness distribution in a diametrical direction at different film formation times in the case of forming a Ti film by using the conventional shower head, wherein FIG. 8A shows a result on an SiO$_2$ film and FIG. 8B shows a result on an Si substrate;

FIGS. 9A and 9B show results of simulating film forming rate distribution and TiCl$_3$ concentration distribution in the diametrical direction in the case of using the conventional shower head and in the case of using a wide shower head, wherein FIG. 9A shows the result of the film forming rate distribution and FIG. 9B shows the result of the TiCl$_3$ concentration distribution;

FIGS. 12A and 12B show results of simulating film forming rate distribution and TiCl$_3$ concentration distribution in the diametrical direction in the case of generating a plasma while varying a gas flow rate between the shower head and the susceptor by using the conventional shower head, wherein FIG. 12A shows the result of the film forming rate distribution and FIG. 12B shows the result of the TiCl$_3$ concentration distribution;

FIGS. 14A and 14B show relation between film formation time and film thicknesses at a center and an outer periphery of a wafer W and an average film thickness in the case of forming a Ti film by using the narrow shower head according to the embodiment, wherein FIG. 14A shows the result on an SiO$_2$ film and FIG. 14B shows the result on an Si substrate;

FIGS. 15A and 15B show film thickness distribution in the diametrical direction at different film formation times in the case of forming a Ti film by using the narrow shower head according to the embodiment, wherein FIG. 15A shows the result on an SiO$_2$ film and FIG. 15B shows the result on an Si substrate; and FIGS. 16A and 16B are schematic diagrams for explaining concept of film thickness control in an outer peripheral portion of a wafer, wherein FIG. 16A shows TiCl$_4$ or TiCl$_3$ distribution in the case of using the conventional shower head and FIG. 16B shows TiCl$_4$ or TiCl$_3$ distribution in the case of using a shower head according to an embodiment.

DETAILED DESCRIPTION OF THE EMBODIMENTS

Hereinafter, embodiments will be described in detail with reference to the accompanying drawings.

In the following description, the case of forming a Ti film as a Ti-containing metal film by plasma CVD will be described as an example.

Figure 1:
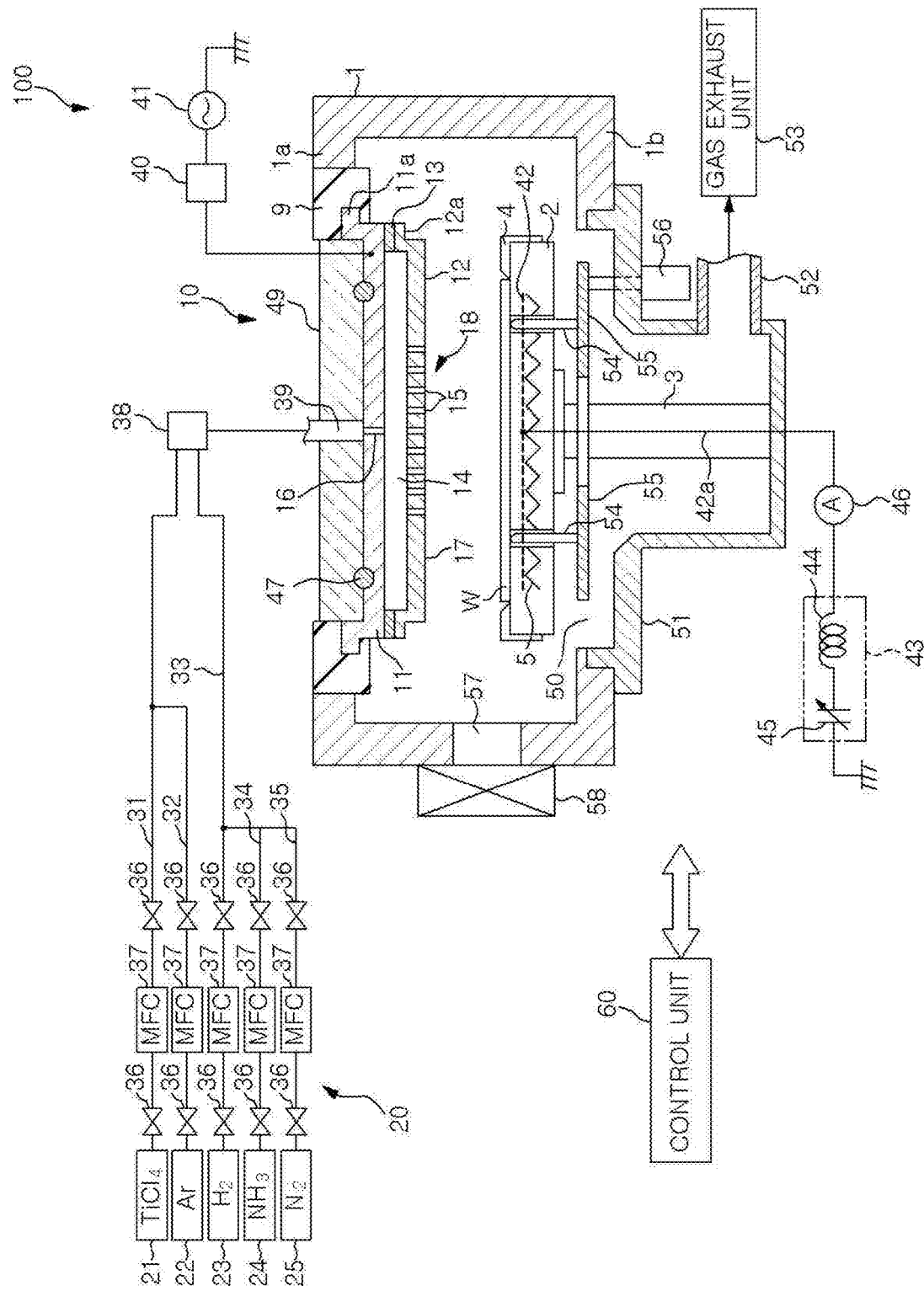
FIG. 1 is a schematic cross sectional view showing an example of a film forming apparatus according to an embodiment.
Figure 2:
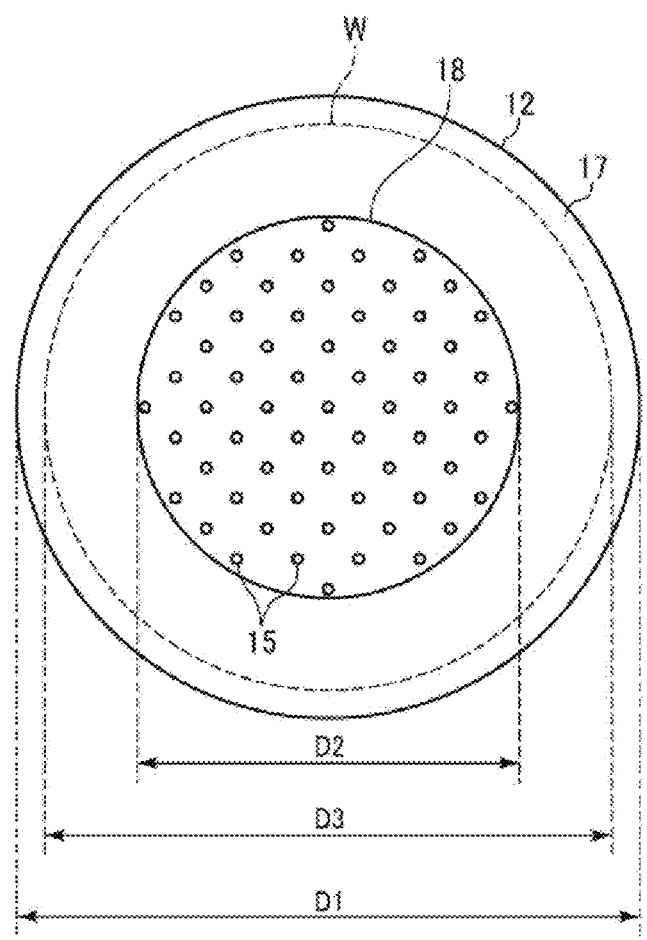
FIG. 2 is a bottom view showing a shower head of the film forming apparatus shown in FIG. 1.

FIG. 1 is a schematic cross sectional view showing an example of a film forming apparatus according to an embodiment. FIG. 2 is a bottom view showing a shower head of the film forming apparatus shown in FIG. 1.

A film forming apparatus 100 is configured as a plasma CVD apparatus for forming a Ti film while generating a plasma by forming a high frequency electric field at parallel plate electrodes.

The film forming apparatus 100 includes a substantially cylindrical processing chamber 1 made of a metal. A circular opening 50 is formed in a central portion of a bottom wall 1b of the processing chamber 1. A gas exhaust chamber 51 projecting downward is provided at the bottom wall 1b to cover the opening 50. A gas exhaust line 52 is connected to a side surface of the gas exhaust chamber 51. The gas exhaust line 52 is also connected to a gas exhaust unit 53. By driving the gas exhaust unit 53, a pressure in the processing chamber 1 can be decreased to a predetermined vacuum level.

Provided at a sidewall of the processing chamber are a loading/unloading port 57 through which a wafer W is transferred between the processing chamber 1 and a wafer transfer chamber (not shown) provided near the processing chamber 1 and a gate valve 58 for opening/closing the loading/unloading port 57.

In the processing chamber 1, a susceptor 2 that is a mounting table (stage) for horizontally supporting a semiconductor wafer, e.g., a silicon wafer (hereinafter, simply referred to as "wafer") W, as a target substrate is supported at a center thereof by a cylindrical supporting member 3. The supporting member 3 is supported at a bottom portion of the gas exhaust chamber 51. The susceptor 2 and the supporting member 3 are made of ceramic such as AlN, Al$_2$O$_3$ or the like. A guide ring 4 for guiding the wafer W is provided at an outer edge of the susceptor 2. A recess for holding the wafer W may be formed at a top surface of the susceptor 2 without providing the guide ring 4. A heater 5 is embedded in the susceptor 2. The heater 5 generates heat by power supplied from a heater power supply (not shown), thereby heating the wafer W to a predetermined temperature via the susceptor 2. An electrode 42 to be described later is embedded in the susceptor 2 and positioned above the heater 5. The susceptor 2 may be made of a metal such as nickel or the like. In that case, the electrode 42 is not required. When the susceptor 2 is made of a metal, an insulating member for insulation from the processing chamber 1 may be interposed therebetween.

The susceptor 2 is provided with three (only two being shown) wafer support pins 54 for supporting and vertically moving the wafer W. The wafer support pins 54 can protrude beyond and retract below the top surface of the susceptor 2. The wafer support pins 54 are supported on a support plate 55. Further, the wafer support pins 54 are vertically moved by a driving mechanism 56 such as an air cylinder or the like through the support plate 55.

A pre-mix type shower head 10 serving as an upper electrode of the parallel plate electrodes is provided at a ceiling wall 1a of the processing chamber 1 through the insulating member 9 to face the susceptor 2. The shower head 10 includes a base member 11 and a shower plate 12. An outer peripheral portion of the shower plate 12 is fixed to the base member 11 by screws (not shown) with an annular intermediate member 13 for preventing adhesion interposed therebetween. The shower plate 12 has a disc shape and a flange 12a is formed at an outer periphery of the shower plate 12. A gas diffusion space 14 is formed between the base member 11 and the shower plate 12. A flange 11a is formed at an outer periphery of the base member 11. The flange 11a is supported by the insulating member 9. The shower plate 12 (e.g., a gas injection member) has a gas injection surface 17 facing the susceptor 2. A plurality of gas injection holes 15 for injecting a gas from the gas injection surface 17 is formed in the shower plate 12. A single gas inlet hole 16 is formed near a center of the base member 11. The gas inlet hole 16 is connected to a gas line of a gas supply unit 20 to be described later. A processing gas supplied from the gas supply unit 20 is introduced into the processing chamber 1 through the shower head 10.

The base member 11 of the shower head 10 is provided with a heater 47 for heating the shower head 10. The heater 47 is connected to a heater power supply (not shown). The shower head 10 is heated to a predetermined temperature by power supplied from the heater power supply to the heater 47. A thermal insulating member 49 is provided in the recess formed at the upper portion of the base member 11.

As shown in FIG. 2, the gas injection surface 17 of the shower plate 12 has a circular shape and is formed in a concentric shape with the wafer W mounted on the susceptor 2. A diameter D1 of the gas injection surface 17 is greater than a diameter D3 of the wafer W. A gas injection hole forming region 18 on the gas injection surface 17 of the shower plate 12 where a plurality of gas injection holes 15 is formed is smaller than a region of the gas injection surface 17 which corresponds to the wafer W, so that the gas injection holes do not exist at a location corresponding to an outer peripheral portion of the wafer W. Specifically, the gas injection hole forming region 18 has a circular shape and is formed in a concentric shape with the wafer W mounted on the susceptor 2. A diameter D2 of the gas injection hole forming region 18 is smaller than the diameter D3 of the wafer W. The "concentric shape" does not necessarily refer to a precisely accurate concentric shape and includes a state in which the central positions are slightly deviated from each other.

When the diameter D3 of the wafer W is 300 mm, the diameter D2 of the gas injection hole forming region 18 is preferably 200 mm to 280 mm and more preferably 220 mm to 260 mm. In other words, a ratio of D2 to D3 is preferably 66.6% to 93.4% and more preferably 73.3% to 86.7%.

In the present embodiment, the gas injection holes 15 are not formed at the outer side of the gas injection hole forming region 18 on the gas injection surface 17. However, the gas injection holes 15 may be formed at the outer side of the gas injection hole forming region 18 as long as the number of the gas injection holes 15 is within a range that allows a desired effect to be obtained.

A diameter of the gas injection hole 15 and an interval between the gas injection holes 15 are the same as those of the conventional shower head. For example, the diameter of the gas injection hole is preferably about 0.50 mm to 7.0 mm and more preferably 0.65 mm to 1.8 mm. The interval between the gas injection holes (distance between the centers of the holes) is preferably 3.0 mm to 10.0 mm and more preferably 4.3 mm to 8.6 mm.

The gas supply mechanism 20 includes: a $TiCl_4$ gas supply source 21 for supplying $TiCl_4$ gas that is a Ti source gas; an Ar gas supply source 22 for supplying Ar gas used as a plasma generation gas and a purge gas; an $H_2$ gas supply source 23 for supplying $H_2$ gas that is a reduction gas; an $NH_3$ gas supply source 24 for supplying $NH_3$ gas that is a nitriding gas; and an $N_2$ gas supply source 25 for supplying $N_2$ gas. The $TiCl_4$ gas supply source 21 is connected to a $TiCl_4$ gas supply line 31. The Ar gas supply source 22 is connected to an Ar gas supply line 32. The $H_2$ gas supply source 23 is connected to an $H_2$ gas supply line 33. The $NH_3$ gas supply source 24 is connected to an $NH_3$ gas supply line 34. The $N_2$ gas supply source 25 is connected to an $N_2$ gas supply line 35. A mass flow controller 37 and two valves 36 disposed at opposite sides of the mass flow controller 37 are disposed in each of the lines.

The $TiCl_4$ gas supply line 31 is connected to the Ar gas supply line 32. The $H_2$ gas supply line 33 is connected to the $NH_3$ gas supply line 34 and the $N_2$ gas supply line 35. The $TiCl_4$ gas supply line 31 and the $H_2$ gas supply line 33 are connected to a gas mixing unit 38. The gases are mixed in the gas mixing unit 38, and a gaseous mixture thereof reaches the gas inlet hole 16 through a gas line 39. Next, the gaseous mixture reaches a gas diffusion space 14 through the gas inlet hole 16 and then is injected toward the wafer W in the processing chamber 1 through the gas injection holes 15 of the shower head 12.

The shower head 10 is connected to a high frequency power supply 41 via a matching unit 40. A high frequency power is supplied from the high frequency power supply 41 to the shower head 10. The shower head 10 functions as the upper electrode of parallel plate electrodes. The electrode 42 embedded in the susceptor 2 functions as the lower electrode of the parallel plate electrodes. Therefore, a high frequency electric field is generated between the shower head 10 and the electrode 42 by supplying the high frequency power to the shower head 10. A processing gas injected through the shower head 10 is turned into a plasma by the high frequency electric field. The high frequency of the high frequency power supply 41 is preferably set to 200 kHz to 13.56 MHz. Typically, a high frequency of 450 kHz is used.

An impedance control circuit 43 is connected to a transmission path 42a connected to the electrode 42. The impedance control circuit 43 is used for increasing a current flowing from the plasma toward the electrode 42 by decreasing an impedance of the transmission path 42a connected to the electrode 42 seen from the plasma. For example, the impedance control circuit 43 includes a coil 44 and a variable capacitor 45. The current flowing through the transmission path 42a is detected by an ampere meter 46. The impedance control circuit 43 controls a reactance of the impedance control circuit 43 based on the detected current value.

The film forming apparatus 100 includes a control unit 60 for controlling the respective components thereof, such as the valve 36, the mass flow controller 37, the matching unit 40, the high frequency power supply 41, the variable capacitor 45, the driving unit 56, the heater power supply and the like. The control unit 60 includes a main controller having a CPU (computer) and configured to control the respective components, an input device, an output device, a display device, and a storage device. A storage medium storing a program, i.e., a processing recipe, for controlling processes performed in the film forming apparatus 100, is set in the storage device. The main controller retrieves a predetermined processing recipe stored in the storage medium and controls the film forming apparatus 100 to perform a predetermined process based on the processing recipe.

Next, a Ti film forming process performed by using the film forming apparatus 100 will be described.

Figure 3:
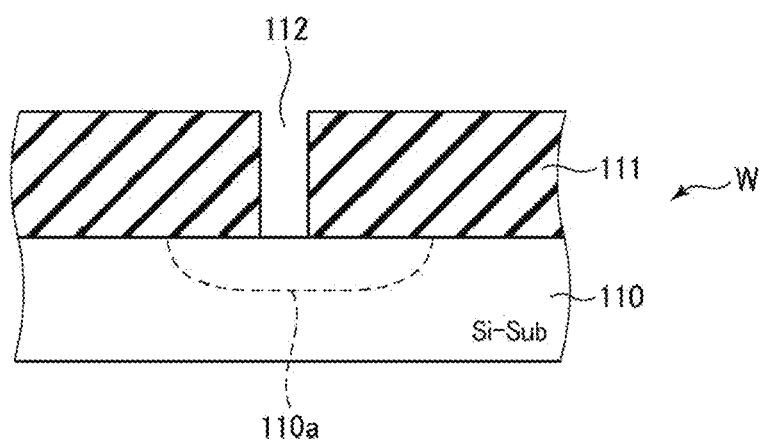
FIG. 3 is a cross sectional view showing a structure example of a wafer used in forming a Ti film.

In the present embodiment, the wafer W has a structure shown in FIG. 3, for example, in which an interlayer insulating film 111 is formed on an Si substrate 110 and a contact hole 112 reaching an impurity diffusion region 110a of the Si substrate 110 is formed in the interlayer insulating film 111.

First, a pressure in the processing chamber 1 is controlled and, then, the gate valve 58 is opened. The wafer W having the structure shown in FIG. 3 is loaded into the processing chamber 1 from a transfer chamber (not shown) through the loading/unloading port 57. Then, the wafer W is preliminarily heated while maintaining the pressure in the processing chamber 1 at a predetermined vacuum level. The heating is performed for a predetermined period of time. When the temperature of the wafer W becomes substantially stable, Ar gas that is a plasma generating gas, $H_2$ gas that is a reduction gas and $TiCl_4$ gas that is a Ti source gas are made to flow in a pre-flow line (not shown), thereby performing pre-flow. Thereafter, the pre-flow line is switched to a film formation line while maintaining the gas flow rates and the pressure, and the gases are introduced into the processing chamber 1 through the shower head 10.

Figure 4A:
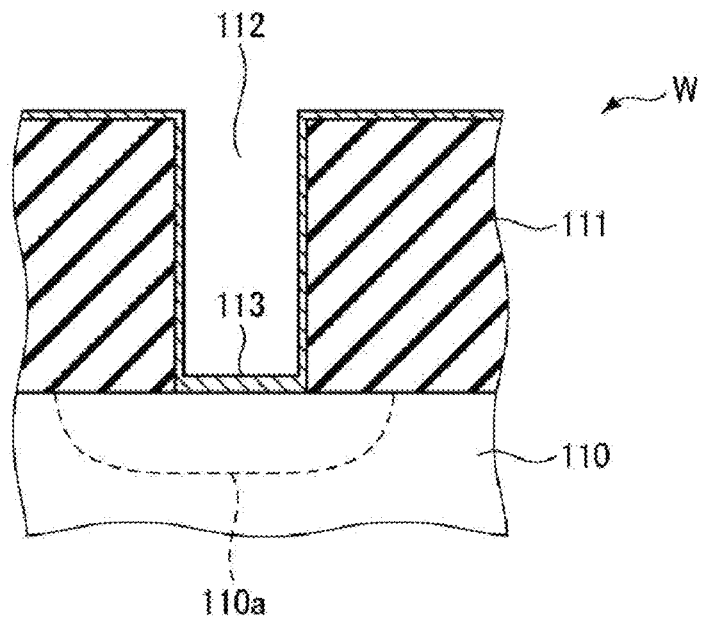
FIGS. 4A and 4B are cross sectional views showing states of the wafer after the Ti film formation and silicidation.
Figure 4B:
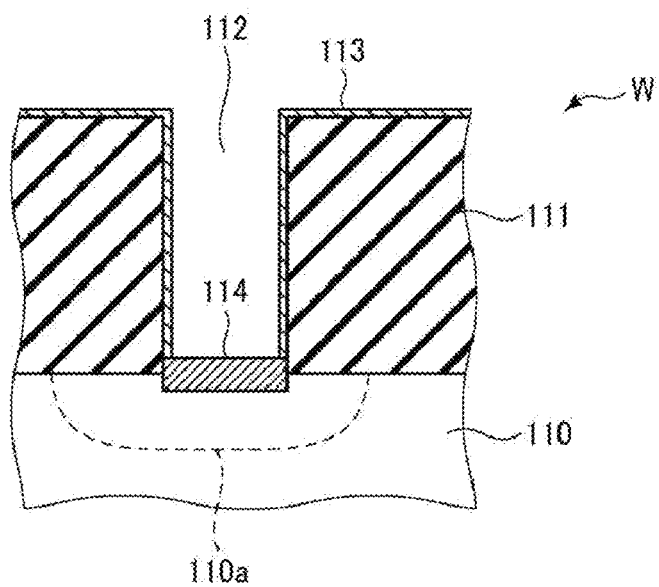

After the gases are introduced, the high frequency power is supplied from the high frequency power supply 41 to the shower head 10. Thus, the plasma of the Ar gas, the $H_2$ gas and the $TiCl_4$ gas is generated in the processing chamber 1. The gases that have turned into the plasma are made to react on the wafer W heated to a predetermined temperature by the heater 5. Accordingly, as shown in FIG. 4A, a Ti film 113 is deposited on a surface of the Si substrate 110 (Si portion). As shown in FIG. 4B, the Ti film 113 and the Si substrate 110 at the bottom portion of the contact hole 112 react with each other, thereby forming a $TiSi_x$ film 114.

At this time, it is preferable that the $TiCl_4$ gas is excited by the plasma and $TiCl_x$ (x being 1 to 4), mainly $TiCl_3$ or $TiCl_2$, is generated as active species. Especially, it is preferable that a flow rate of $H_2$ gas with respect to a flow rate of $TiCl_4$ gas is minimized and $TiCl_3$ having an attachment coefficient lower than that of $TiCl_2$ is generated as active species generated by the plasma. In addition, it is preferable that etching action of Ar ions is promoted by maximizing a flow rate of the Ar gas. Here, "mainly $TiCl_3$" refers to a state in which $TiCl_4$ is decomposed to $TiCl_2$ and $TiCl_3$ and a condition $TiCl_2 < TiCl_3$ is satisfied. Accordingly, a Ti film having a high step coverage can be obtained while minimizing overhang at an opening of a hole. Further, due to the action of promoting separation of Cl adsorbed onto the surface of the Ti film by impact of the Ar ions, a Ti film having a low resistance and a small amount of residual chlorine can be formed at a low film formation temperature of 500° C. or less.

From the above, it is preferable to set the gas flow rates for the film formation as follow.

$TiCl_4$ gas flow rate: 1 to 200 ml/min (sccm)
Ar gas flow rate: 100 to 10000 ml/min (sccm)
$H_2$ gas flow rate: 1 to 10000 ml/min (sccm)
More preferably, the gas flow rates are set as follows.
$TiCl_4$ gas flow rate: 3 to 50 ml/min (sccm)
Ar gas flow rate: 100 to 5000 ml/min (sccm)
$H_2$ gas flow rate: 5 to 5000 ml/min (sccm)
Further, a flow rate ratio of $H_2$ gas/Ar gas is preferably 0.001 to 50.

In the following description, ml/min is used as a unit for a gas flow rate. Since, however, a volume of a gas greatly changes depending on a temperature and an atmospheric pressure, a value converted to a standard state is used in the disclosure. The flow rate converted to the standard state is generally represented by sccm (Standard Cubic Centimeter per Minutes), so that sccm is also described. The standard state used herein indicates a state in which a temperature is 0° C. (273.15 K) and an atmospheric pressure is 1 atm (101325 Pa).

A film formation temperature can range from 300° C. to 700° C. In order to ensure heat resistance of devices and suppress diffusion of impurities, it is preferable that the film formation temperature is lower than or equal to 500° C. In the present embodiment, the action of Ar ions is promoted as described above, so that a Ti film having a low resistance and a small amount of residual chlorine can be formed at a low temperature of 500° C. or less, which is a desirable film formation temperature for devices. When the temperature is excessively low, it is difficult to obtain a satisfactory film quality. Therefore, a temperature of 350° C. or above is preferable. In other words, a desired film formation temperature (wafer temperature) is 350° C. to 500° C.

As the pressure in the processing chamber 1 is decreased, the plasma damage is reduced. However, if the pressure is excessively decreased, the in-plane uniformity (resistance) of the Ti film deteriorates considerably. If the pressure is excessively increased, the resistance of the Ti film is increased, which is not preferable. Therefore, a preferable range of the pressure is determined in consideration of the above features. A preferable range of the pressure is 13.3 Pa to 1333 Pa (0.1 Torr to 10 Torr).

The high frequency power needs to be increased to enhance the action of Ar ions. However, if the high frequency power is increased, the current flowing from the plasma toward the chamber wall portion is increased. Accordingly, the plasma becomes unstable, which may lead to abnormal discharge or the like. In order to enhance the action of Ar ions without increasing the high frequency power, the impedance control circuit 43 is provided in the transmission path 42a connected to the electrode 42 in the susceptor 2 and the impedance of the transmission path 42a seen from the plasma is controlled.

Figure 5:
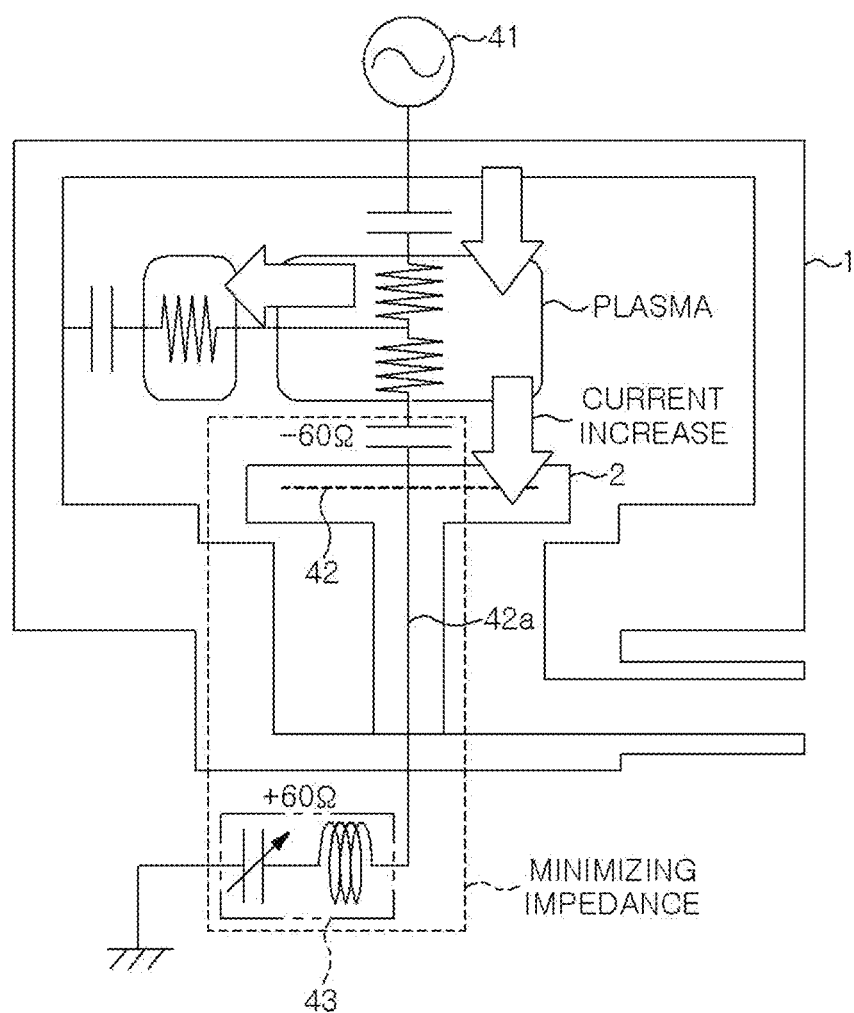
FIG. 5 schematically shows the film forming apparatus to explain a function of an impedance control circuit.

In other words, capacity elements, such as a plasma sheath and the susceptor 2, exist as resistors between the plasma and the wafer W. However, as shown in FIG. 5, the capacity components are canceled by the impedance control circuit 43 and the impedance of the transmission path 42a is minimized. As a consequence, it is possible to effectively increase the current flowing from the plasma toward the transmission path 42a through the wafer W and also possible to sufficiently promote the action of Ar ions by a comparatively low power. By increasing the current flowing from the plasma toward the wafer W, the current flowing from the plasma toward the chamber wall portion can be relatively decreased and the stability of the plasma can be increased.

The configuration of the impedance control circuit is not limited to the configuration in which the coil 44 and the variable capacitor 45 are combined to adjust impedance as shown in FIG. 1.

By performing a process in which $TiCl_3$ and Ar ions mainly act, a Ti film having a high step coverage and a low resistance can be formed at a low temperature of 500° C. or less. However, it has been found that the film thickness becomes non-uniform and thinner at the outer peripheral portion of the wafer W in the case of using a conventional film forming apparatus.

Figure 6:
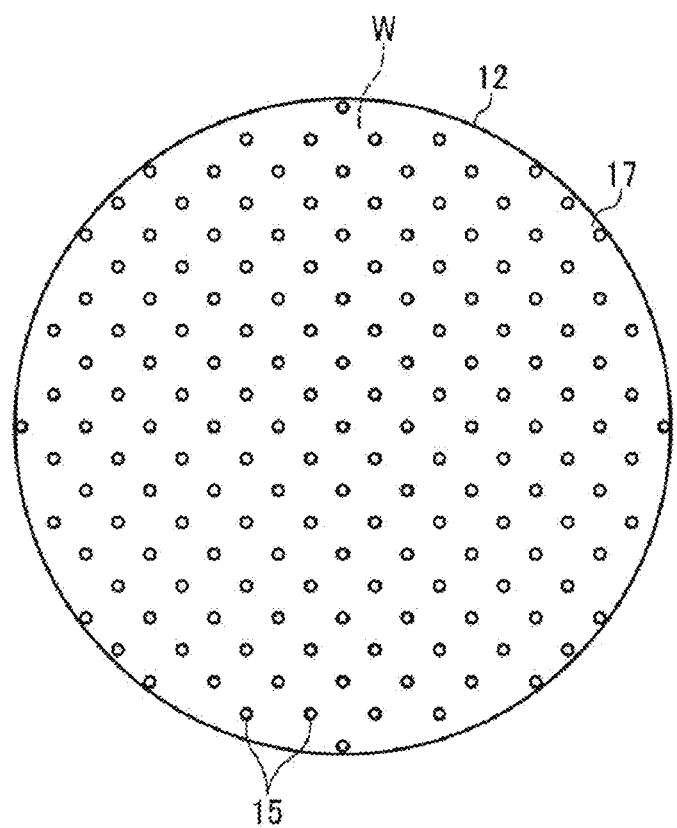
FIG. 6 is a bottom view showing a conventional shower head.

Specifically, in the conventional film forming apparatus, there is used the shower head shown in FIG. 6, in which the gas injection holes 15 are formed substantially on the entire area of the gas injection surface 17 of the shower plate 12 and a diameter of the gas injection hole forming region is greater than or equal to a diameter of the wafer W. The distribution of the film thickness is shown in FIGS. 7A, 7B, 8A and 8B.

Figure 7A:
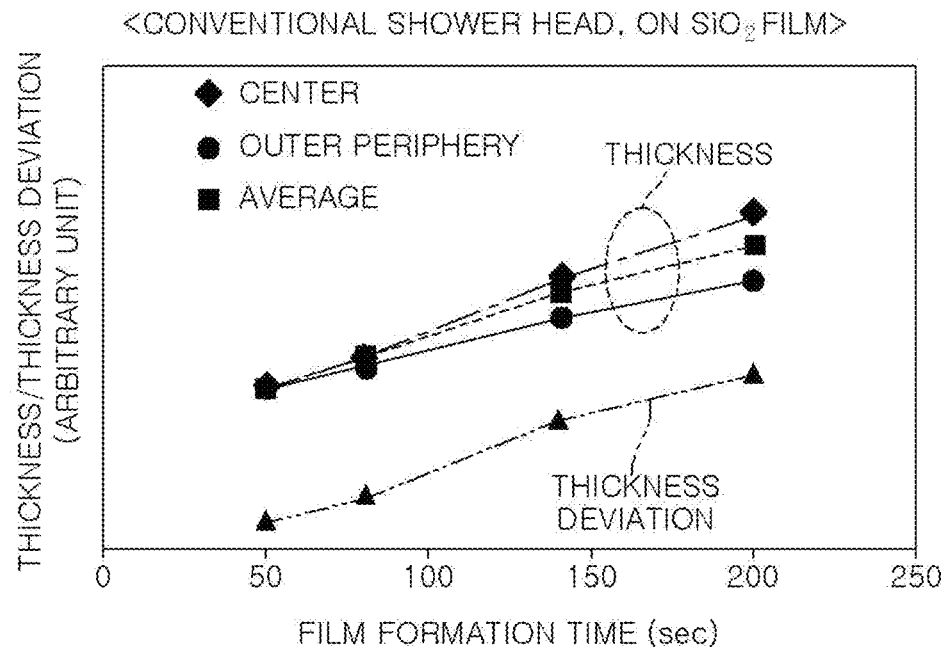
Figure 7B:
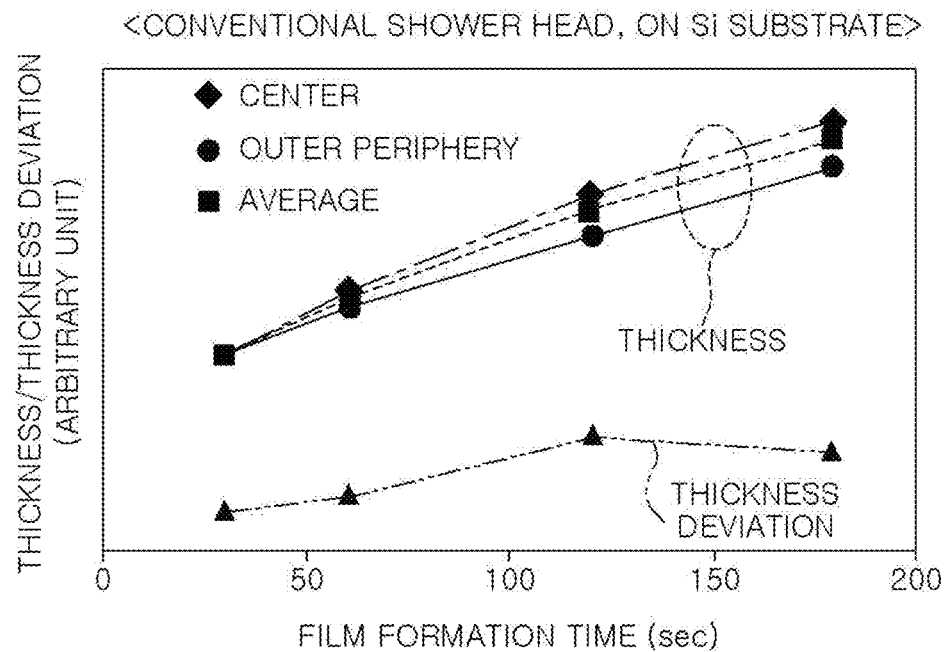
Figure 8A:
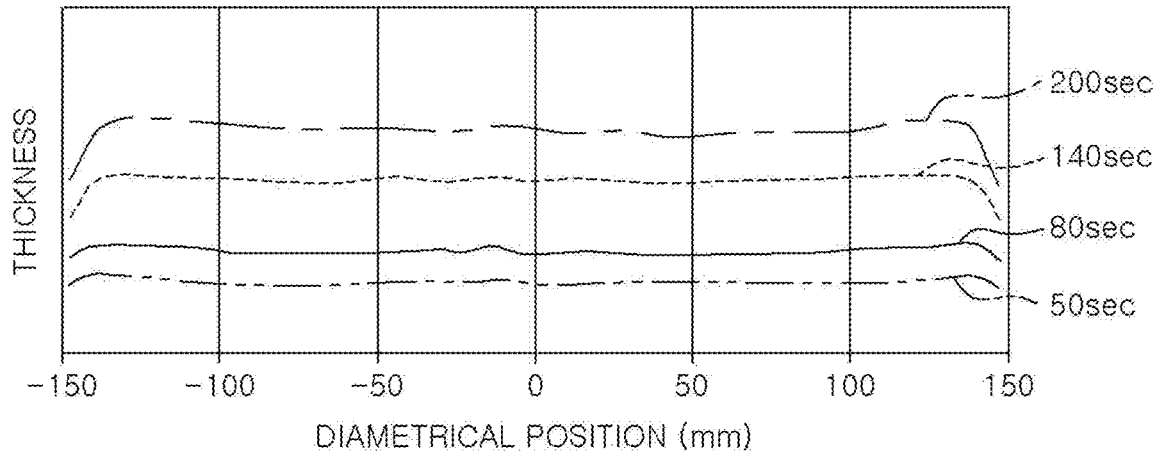
Figure 8B:
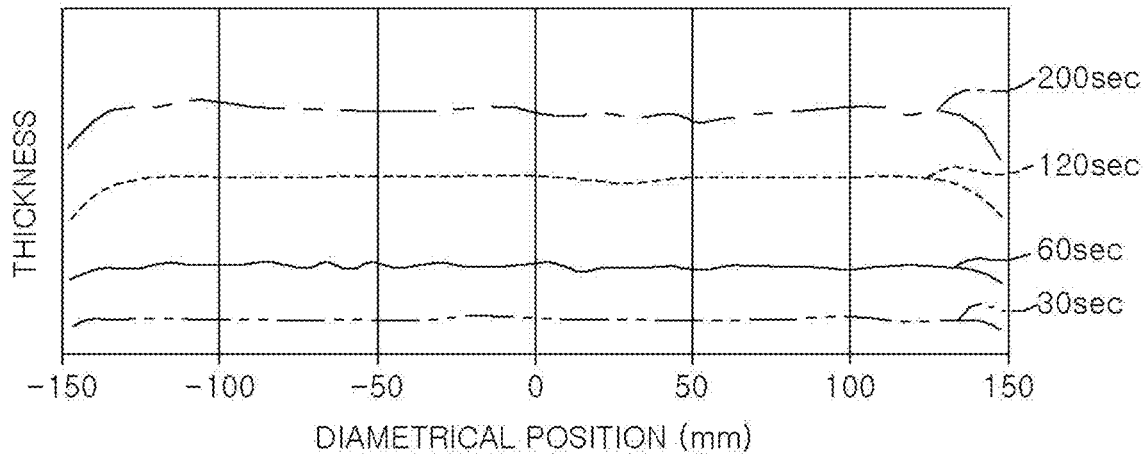

FIGS. 7A and 7B show relation between a film formation time and film thicknesses at the center and the outer periphery of the wafer W and an average film thickness in the case of forming a Ti film by using the conventional shower head, wherein FIG. 7A shows a result on an $SiO_2$ film and FIG. 7B shows a result on an Si substrate. As can be seen from FIGS. 7A and 7B, a difference in the film thickness between the center and the outer periphery is increased as the film formation time is increased. FIGS. 8A and 8B show film thickness distribution in a diametrical direction at different film formation times in the case of forming a Ti film by using the conventional shower head, wherein FIG. 8A shows a result on an SiO$_2$ film and FIG. 8B shows a result on an Si substrate. As can be seen from FIGS. 8A and 8B, the film thickness is decreased at the outer peripheral portion of the wafer in the case of using the conventional shower head.

The reason that the film thickness is decreased at the outer peripheral portion of the wafer is because the concentration of TiCl$_3$ contributing to the film formation is decreased at the outer peripheral portion of the wafer. Therefore, it was attempted to supply TiCl$_4$ to a portion expanded diametrically further than that in the conventional case by using a shower head (wide shower head) having a larger gas injection hole forming region than that in the conventional shower head. In that case, a diameter of the gas injection hole forming region was set to φ362 mm by increasing the area of the gas injection surface of the shower plate in the wide shower head, whereas a diameter of the gas injection hole forming region was φ314 mm in the conventional shower head.

Figure 9A:
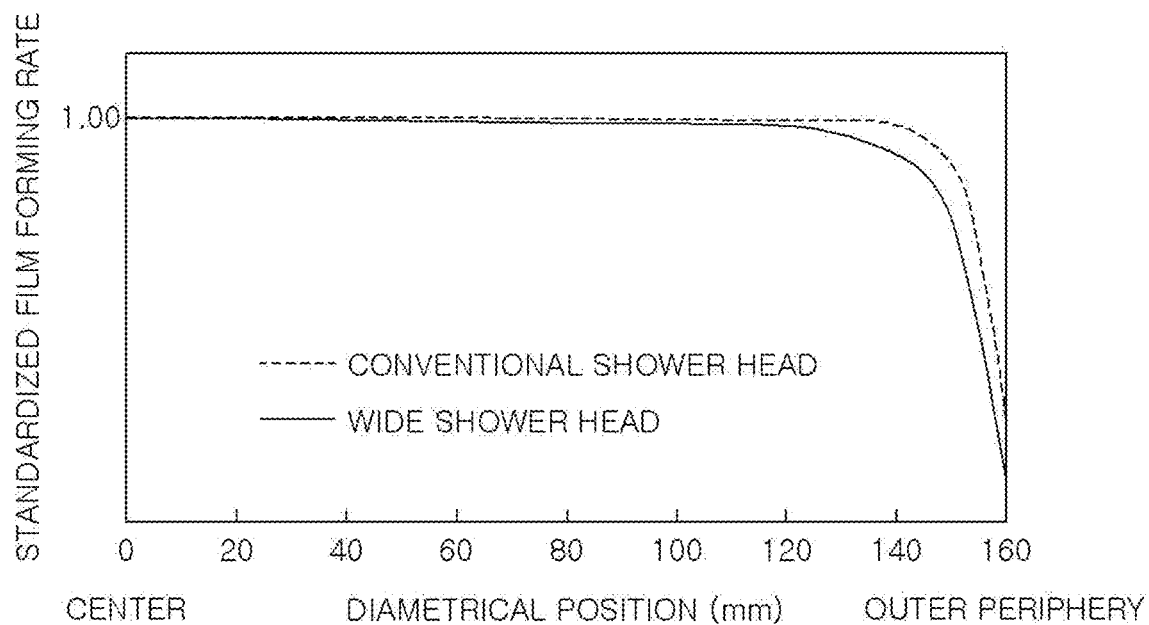
Figure 9B:
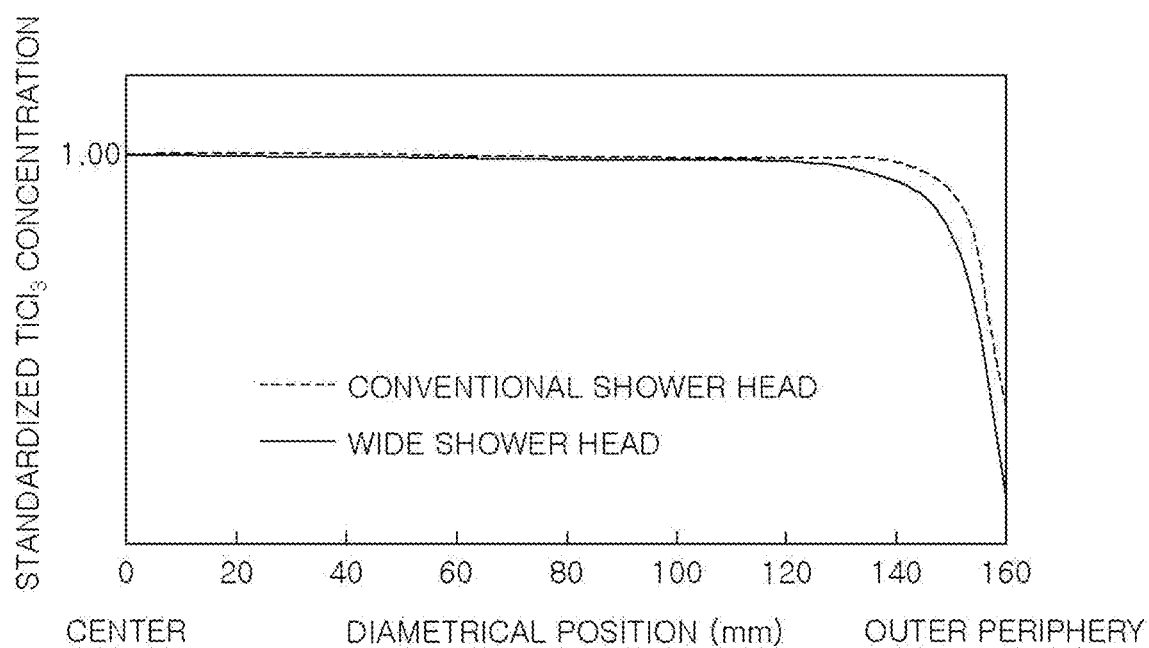

FIGS. 9A and 9B show results of simulating film forming rate distribution and TiCl$_3$ concentration distribution in the diametrical direction in the case of using the conventional shower head and in the case of using the wide shower head, wherein FIG. 9A shows the result of the film forming rate distribution and FIG. 9B shows the result of the TiCl$_3$ concentration distribution. As can be seen from FIGS. 9A and 9B, the film forming rate and the TiCl$_3$ concentration were decreased at the diametrically inner side in the case of using the wide shower head, compared to the case of using the conventional shower head, unlike expectation.

Figure 10A:
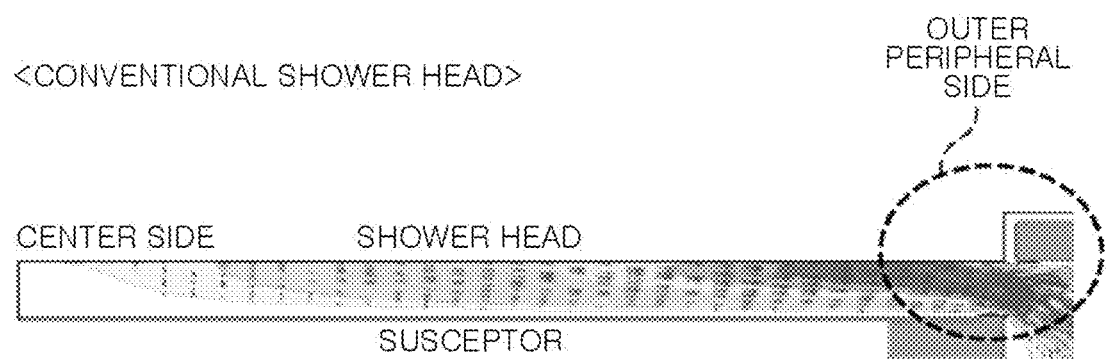
FIGS. 10A and 10B show results of simulating flow velocity distribution in a plasma between the shower head and a susceptor in the case of using the conventional shower head and in the case of using the wide shower head.
Figure 10B:
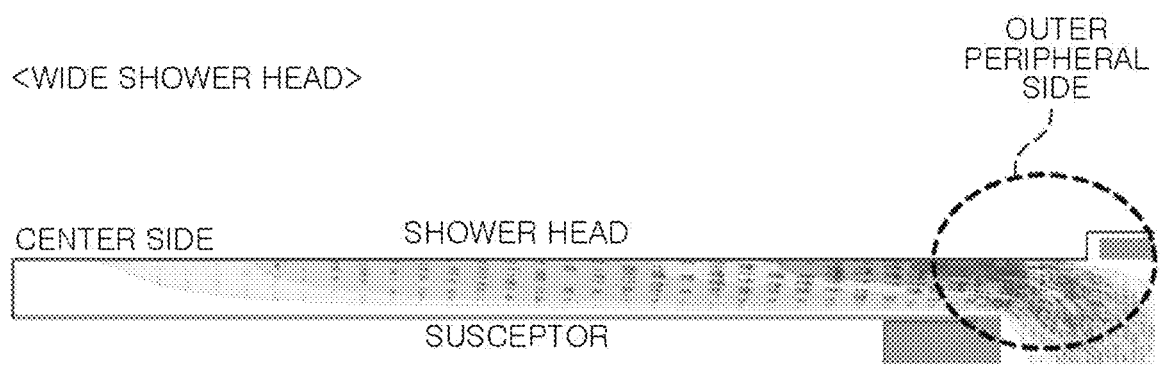

FIGS. 10A and 10B show results of simulating flow velocity distribution in a plasma between the shower head and the susceptor, wherein FIG. 10A shows the result in the case of using the conventional shower head and FIG. 10B shows the result in the case of using the wide shower head. In FIGS. 10A and 19B, the results at the outer peripheral side are mainly illustrated. A darker portion indicates a higher flow velocity. As can be seen from FIGS. 10A and 10B, in the wide shower head, a flow velocity between the shower head and the susceptor is decreased as the gas injection hole forming region is enlarged to the diametrically outer side. Therefore, it is considered that, in the wide shower head, a pressure is decreased due to the decrease in the flow velocity between the shower head and the susceptor and a position at which the film forming rate starts to be decreased is moved toward the diametrically inner side by a decrease in a convective flux of TiCl$_3$ toward a downstream side.

Figure 11A:
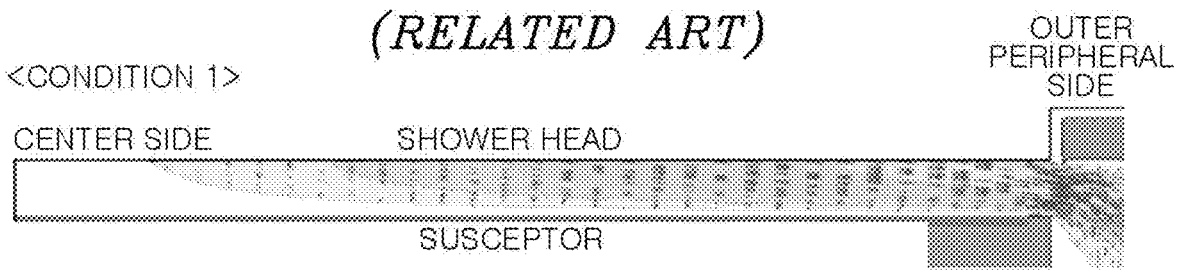
FIGS. 11A and 11B show results of simulating flow velocity distribution in a plasma between the shower head and the susceptor in the case of generating a plasma while varying a gas flow rate between the shower head and the susceptor by using the conventional shower head.
Figure 11B:
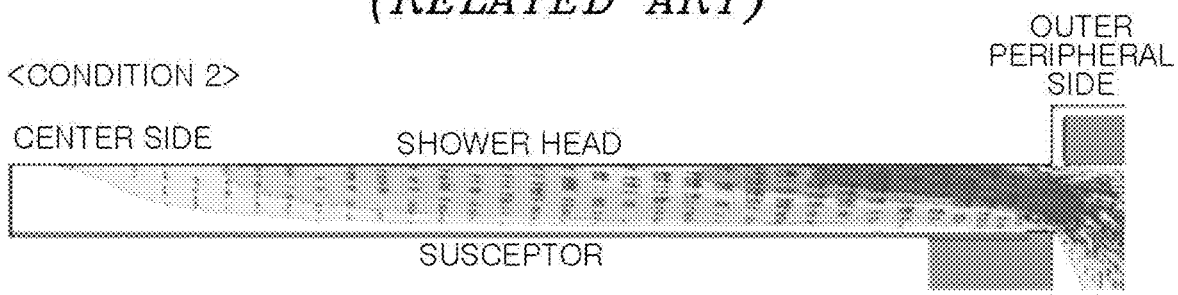

In order to examine the above phenomenon, a test was performed by using the conventional shower head while varying the flow rates of the gases supplied to a space between the shower head and the susceptor. The flow rates of TiCl$_4$/H$_2$/Ar under a condition 2 were set to be substantially twice greater than those under a condition 1. FIGS. 11A and 11B show results of simulating flow velocity distribution in a plasma between the shower head and the susceptor, wherein FIG. 11A shows the result obtained under the condition 1 and FIG. 11B shows the result obtained under the condition 2. In FIGS. 11A and 11B, the results at the outer peripheral side are mainly illustrated. A darker portion indicates a higher flow velocity. As can be seen from FIGS. 11A and 11B, the flow velocity at the outer peripheral portion is higher under the condition 2 than under the condition 1.

Figure 12A:
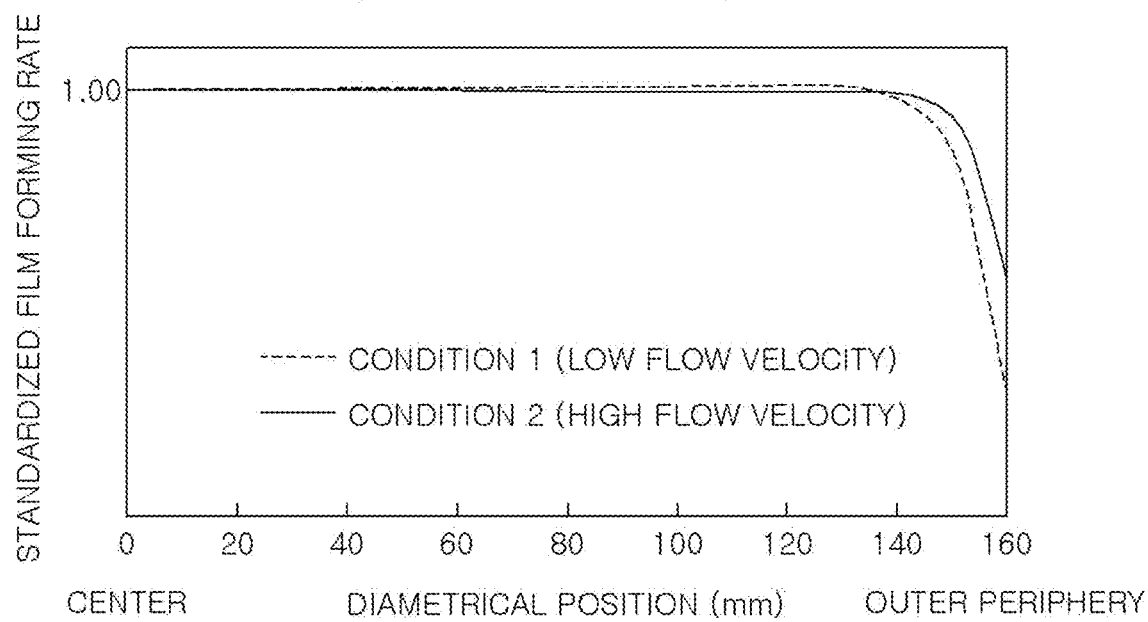
Figure 12B:
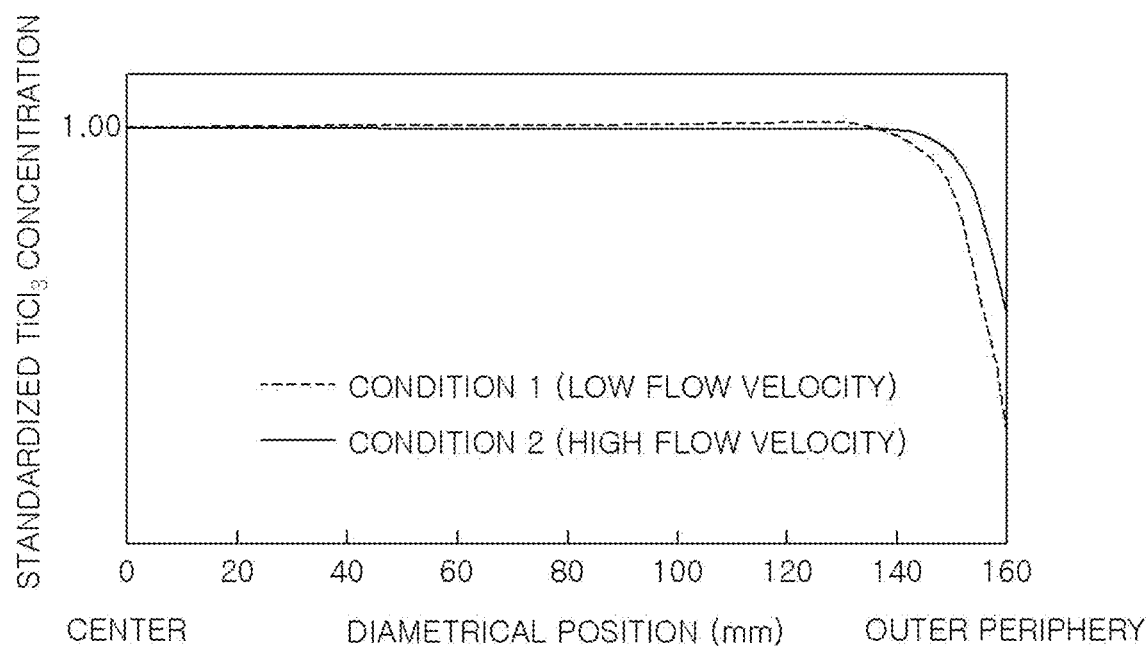

FIGS. 12A and 12B show results of simulating film forming rate distribution and TiCl$_3$ concentration distribution in the diametrical direction under the conditions 1 and 2, wherein FIG. 12A shows the result of the film forming rate distribution and FIG. 12B shows the result of the TiCl$_3$ concentration distribution. As can be seen from FIGS. 12A and 12B, the film forming rate and the TiCl$_3$ concentration were decreased at the diametrically inner side under the condition 1 than under the condition 2. This indicates that the decrease in the flow velocity between the shower head and the susceptor leads to the decrease in the TiCl$_3$ concentration and the decrease in the film forming rate at the outer peripheral portion of the wafer.

In the case of using the wide shower head, the flow velocity of the gas between the shower head and the susceptor was decreased and, thus, the TiCl$_3$ concentration at the outer peripheral portion of the wafer was decreased. Accordingly, the position at which the film forming rate starts to be decreased was moved to the diametrically inner side.

Therefore, in the present embodiment, in order to increase the flow velocity of the gas between the shower head and the susceptor, the shower head 10 is configured in such a manner that the gas injection hole forming region 18 on the gas injection surface 17 of the shower plate 12 where the gas injection holes 15 are formed is smaller than the region corresponding to the wafer W.

The flow velocity and the TiCl$_3$ concentration in the plasma between the shower head and the susceptor in the case of using the conventional shower head and in the case of using the shower head (narrow shower head) of the present embodiment in which the gas injection hole forming region is smaller than the region corresponding to the wafer were compared by simulation. A diameter of the gas injection hole forming region in the narrow shower head was set to φ200 mm (wafer diameter: 300 mm).

Figure 13A:
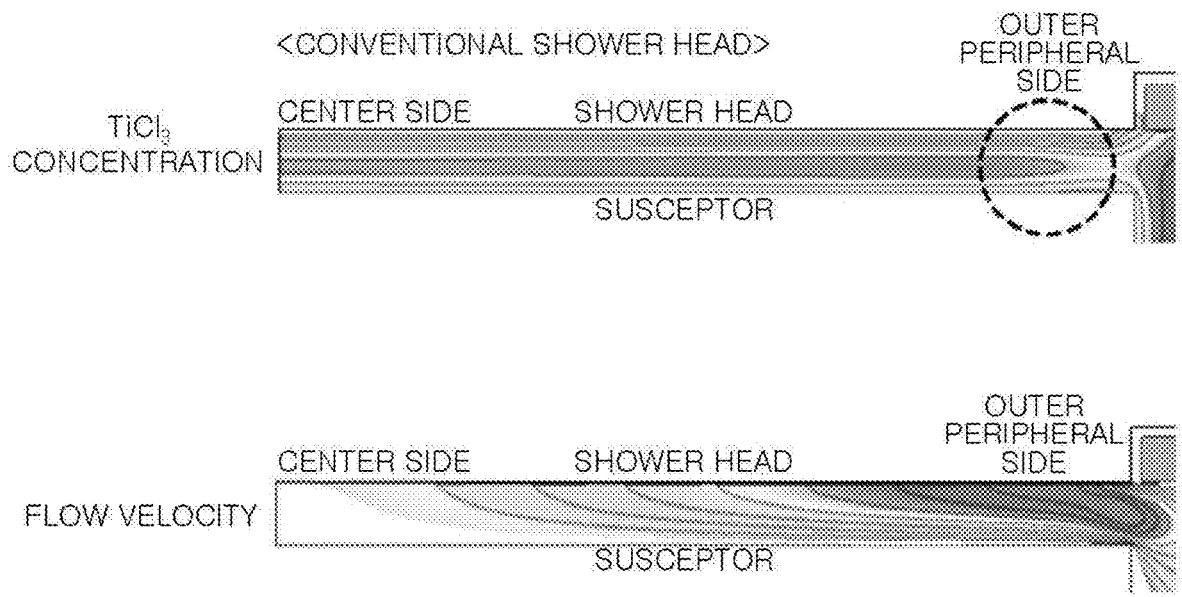
FIGS. 13A and 13B shows simulation results of comparison between TiCl$_3$ concentration distribution and flow velocity distribution in the plasma between the shower head and the susceptor in the conventional shower head and a narrow shower head according to an embodiment.
Figure 13B:
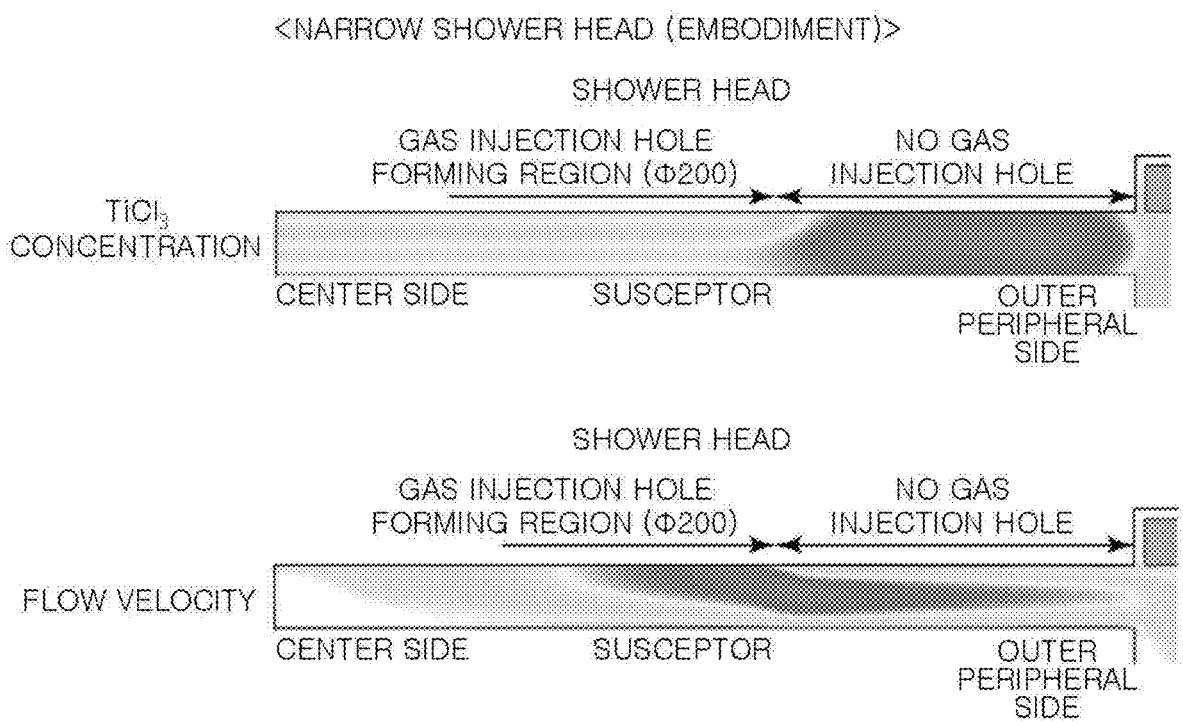

The results thereof are shown in FIGS. 13A and 13B. FIG. 13A shows the result obtained in the case of using the conventional shower head and FIG. 13B shows the result obtained in the case of using the narrow shower head. In FIGS. 13A and 13B, at the outer peripheral side, a darker portion indicates a higher flow velocity and a higher TiCl$_3$ concentration. As can be seen from FIGS. 13A and 13B, in the case of using the conventional shower head, the flow velocity between the shower head and the susceptor is low and the TiCl$_3$ concentration tends to be decreased at the outer peripheral portion of the wafer. On the other hand, the position where the flow velocity is increased in the narrow shower head of the present embodiment is diametrically inner than that in the conventional shower head, and the TiCl$_3$ concentration is increased at a position immediately outside the gas injection hole forming region and maintained at a high level even at the outer peripheral portion where the gas injection holes are not formed.

Next, actual film thickness distribution was obtained by using the narrow shower head.

Figure 14A:
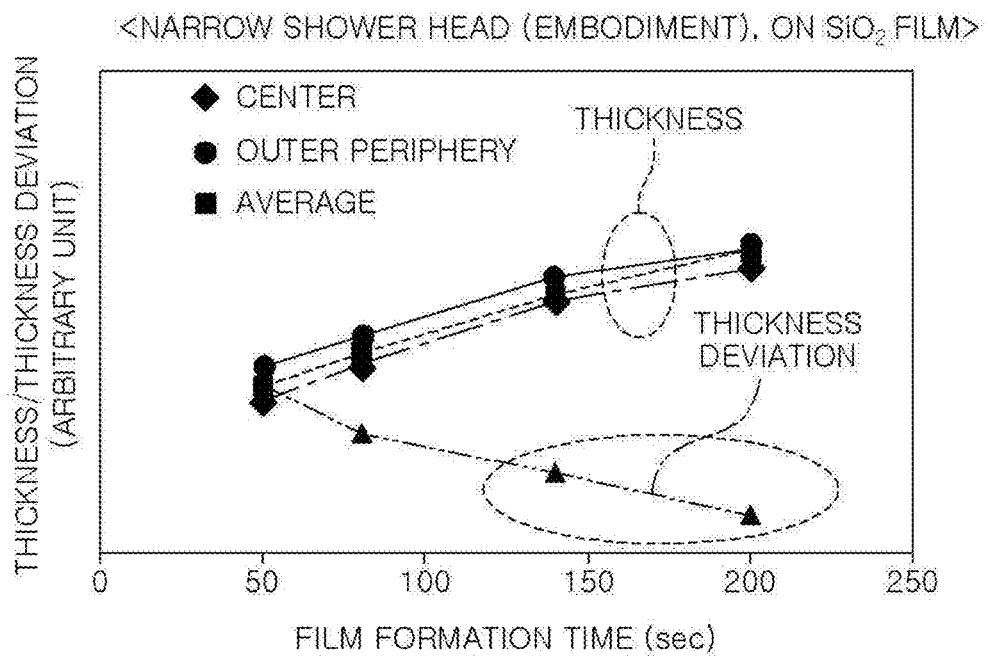
Figure 14B:
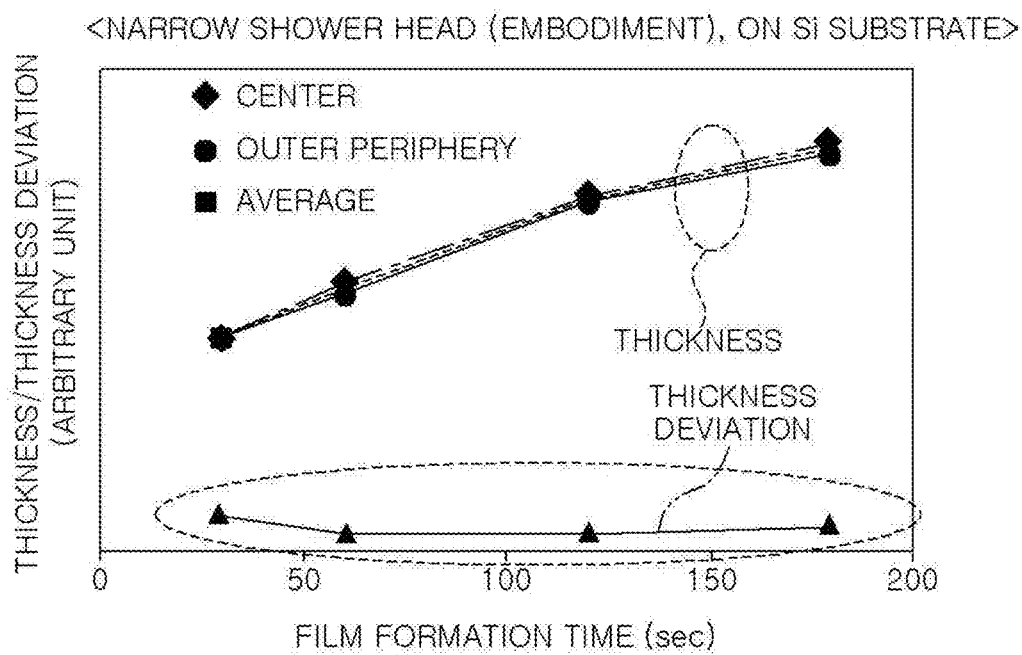
Figure 15A:
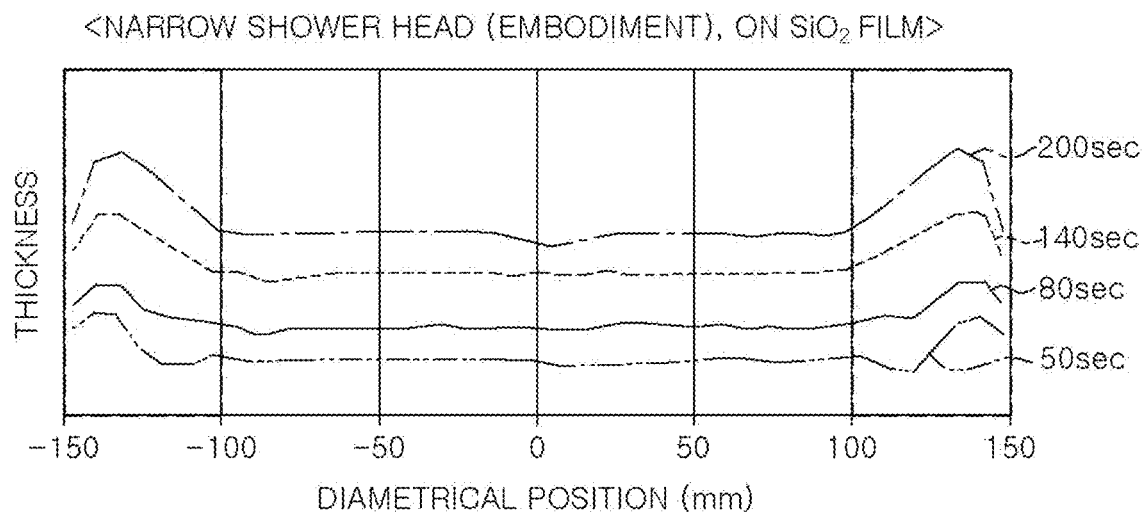
Figure 15B:
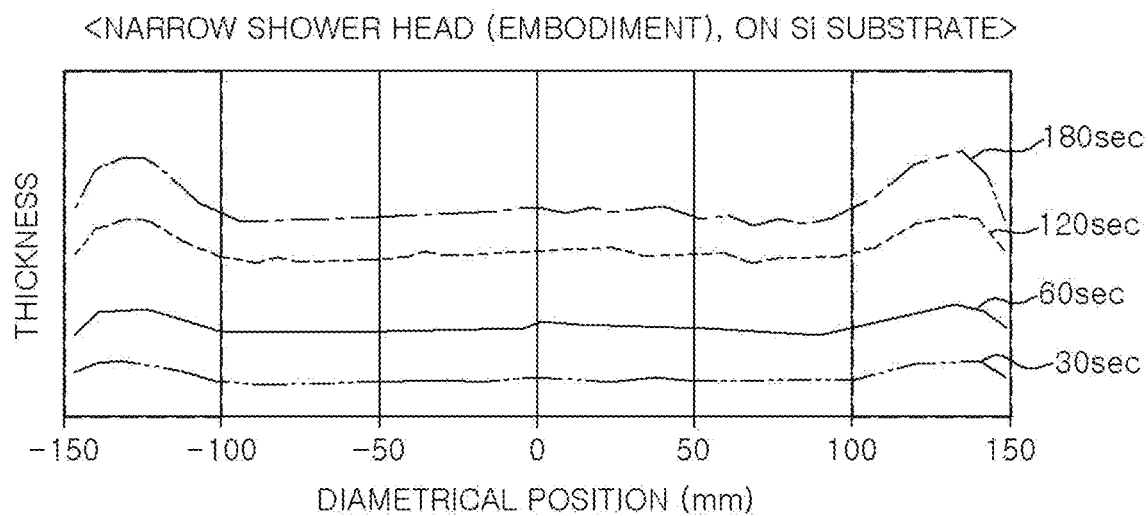

FIGS. 14A and 14B show relation between film formation time and film thicknesses at the center and the outer periphery of a wafer W and an average film thickness in the case of forming a Ti film by using the narrow shower head, wherein FIG. 14A shows the result on an SiO$_2$ film and FIG. 14B shows the result on an Si substrate. As clearly seen from comparison with FIG. 7, in the case of using the narrow shower head, the film thickness difference between the center and the outer periphery is not increased as the film formation time is increased while the film thickness difference between the center and the outer periphery is increased as the film formation time is increased in the case of using the conventional shower head. FIGS. 15A and 15B show film thickness distribution in the diametrical direction at different film formation times in the case of forming a Ti film by using the narrow shower head, wherein FIG. 15A shows the result on an SiO₂ film and FIG. 15B shows the result on an Si substrate. As clearly seen from comparison with FIG. 8, in the case of using the narrow shower head, the film thickness at the outer peripheral portion of the wafer is greater than that in the case of using the conventional shower head while the film thickness is abruptly decreased at the outer peripheral portion of the wafer in the case of using the conventional shower head.

From the above, it is clear that the film thickness at the outer peripheral portion of the wafer can be increased by employing the configuration of the shower head 10 in which the gas injection hole forming region 18 on the gas injection surface 17 of the shower plate 12 where the gas injection holes 15 are formed is smaller than the region corresponding to the wafer W.

Figure 16A:
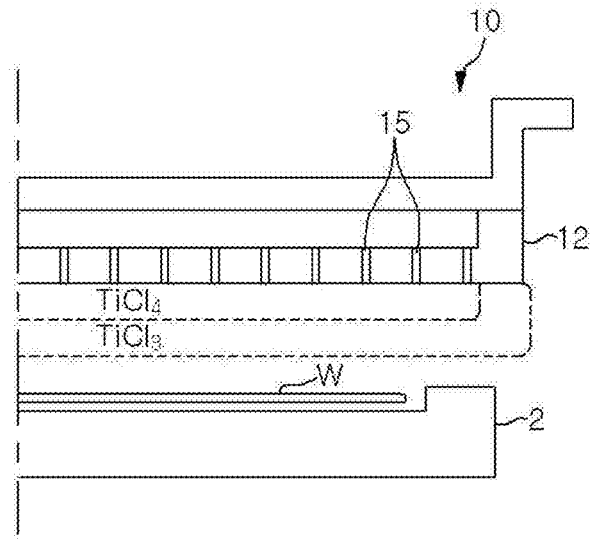
Figure 16B:
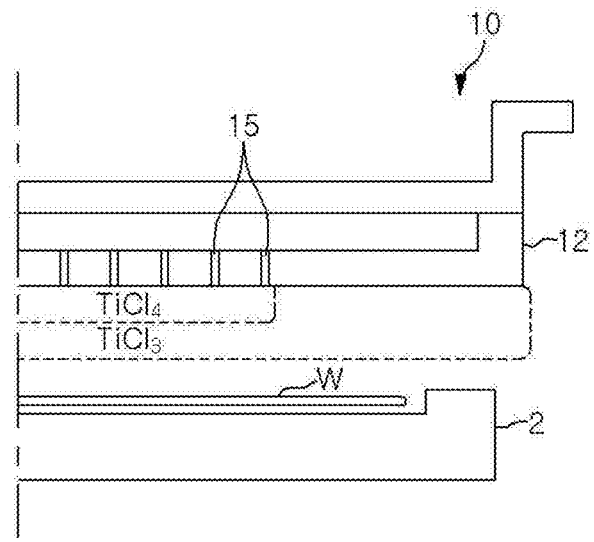

FIGS. 16A and 16B schematically show concept of film thickness control at the outer peripheral portion of the wafer. In the case of using the conventional shower head, as shown in FIG. 16A, the gas injection holes 15 are also formed in a region corresponding to the radially outer side of the wafer W. TiCl₄ is injected through the gas injection holes 15 and becomes TiCl₃ in the plasma. In that case, as described above, the concentration of TiCl₃ contributing to the film formation is decreased at the outer peripheral portion of the wafer W and, thus, the film thickness is decreased. On the other hand, in the narrow shower head of the present embodiment, as shown in FIG. 16B, the gas injection holes are formed only in a region corresponding to the central region of the wafer W. Therefore, TiCl₄ is efficiently converted to TiCl₃ at the outer peripheral portion of the wafer W. Accordingly, the TiCl₃ concentration at the portion corresponding to the outer peripheral portion of the wafer W is increased, and the film thickness at the outer peripheral portion of the wafer W is increased.

The film thickness at the outer peripheral portion of the wafer can be controlled by the size of the gas injection hole forming region 18. By optimizing the size of the gas injection hole forming region 18 depending on the film thickness distribution, the uniformity of the film thickness distribution in the diametrical direction can be improved.

Specifically, the gas injection hole forming region 18 has a circular shape and is formed in a concentric shape with the wafer W mounted on the susceptor 2. The diameter D2 of the gas injection hole forming region 18 is smaller than the diameter D3 of the wafer W. In order to effectively control the film thickness at the outer peripheral portion of the wafer, when the diameter D3 of the wafer W is 300 mm, the diameter D2 of the gas injection hole forming region 18 is preferably 200 mm to 280 mm and more preferably 220 mm to 260 mm. In other words, a ratio of D2 to D3 is preferably 66.6% to 93.4% and more preferably 73.3% to 86.7%.

After the Ti film is formed by the film forming apparatus 100 using the above-described shower head, the Ti film may be nitrided, if necessary. In the nitriding process, in a state where the supply of TiCl₄ gas is stopped and the supply of H₂ gas and Ar gas is continued after the completion of the Ti film formation, the processing chamber 1 is heated to a proper temperature and NH₃ gas is supplied as a nitriding gas. The high frequency power is supplied from the high frequency power supply 41 to the shower head 10 to convert the processing gas to a plasma. A surface of the Ti film is nitrided by the plasma of the processing gas. As a consequence, the Ti film is protected.

Upon completion of the Ti film formation or the nitriding process, the gate valve 58 is opened and the wafer W is unloaded to the wafer transfer chamber (not shown) through the loading/unloading port 57.

The present disclosure is not limited to the above embodiment and may be variously modified without departing from the scope of the present disclosure.

For example, in the above example, the film formation was performed by simultaneously supplying a source gas and a reduction gas. However, the film formation may be performed by an ALD (Atomic Layer Deposition) method in a state where a plasma is generated by alternately supplying a film forming gas and a reduction gas with a purge process using an inert gas such as Ar gas or the like interposed therebetween.

Although the case of forming a Ti film by plasma CVD has been described in the above embodiment, the present disclosure may be applied to the case of forming a Ti-containing metal film by adding a nitrogen source during the Ti film formation. Further, the present disclosure may be applied to any apparatus for generating a plasma between the shower head and the susceptor and forming a predetermined film by generating active species of a source gas.

In the above embodiment, a plasma is generated by forming a high frequency electric field by applying the high frequency power to the shower head. However, the high frequency power may be applied to the susceptor. Further, another plasma generation unit for generating an inductively coupled plasma, a microwave plasma or the like may be used instead of the parallel plate type plasma generation unit described in the above embodiment.

Although the case in which the semiconductor wafer is used as the target substrate has been described, the present disclosure may be applied to another target substrate such as a glass substrate, a ceramic substrate or the like.

While the disclosure has been shown and described with respect to the embodiments, it will be understood by those skilled in the art that various changes and modifications may be made without departing from the scope of the disclosure as defined in the following claims.

What is claimed is:

1. A film forming apparatus for forming a film on a target substrate using a processing gas excited by plasma, the apparatus comprising:

a processing chamber configured to accommodate the target substrate;

a mounting table configured to mount thereon the target substrate in the processing chamber;

a gas injection member provided to face the target substrate mounted on the mounting table and configured to inject the processing gas toward the target substrate on the mounting table; and a plasma generation unit configured to excite the processing gas by generating plasma between the gas injection member and the mounting table;

wherein the gas injection member formed in a concentric shape with a guide ring or recess for holding the target substrate, the gas injection member having a gas injection surface facing the mounting table, wherein the gas injection surface includes a gas injection hole forming region at a center and a peripheral region surrounding the gas injection hole forming region, wherein a plurality of gas injection holes are formed only in the gas injection hole forming region, and the gas injection hole forming region is smaller than a region on the gas injection surface corresponding to the guide ring or the recess when seen from a top view perspective, wherein the gas injection hole forming region is concentric with the region corresponding to the guide ring or the recess and a diameter of the gas injection hole forming region is smaller than an inner diameter of the region corresponding to the guide ring or an outer diameter of the region corresponding to the recess, and wherein a ratio of the diameter of the gas injection hole forming region to the inner diameter of the region corresponding to the guide ring or the outer diameter of region corresponding to the recess is 66.6% to 93.4%.

2. The film forming apparatus of claim 1, wherein the plasma generation unit generates a plasma by forming a high frequency electric field between the mounting table serving as a lower electrode and the gas injection member serving as an upper electrode.

3. The film forming apparatus of claim 1, wherein a ratio of the diameter of the gas injection hole forming region to the diameter of the region corresponding to the guide ring or the recess is 73.3% to 86.7%.

4. The film forming apparatus of claim 1, wherein the processing gas injected from the gas injection member includes $TiCl_4$ gas that is a source gas, $H_2$ gas that is a reduction gas, Ar gas that is a plasma generation gas, and a Ti-containing metal film is formed on the target substrate.

5. The film forming apparatus of claim 4, wherein $TiCl_3$ is mainly generated as active species by exciting the $TiCl_4$ gas by the plasma.

6. The film forming apparatus of claim 5, further comprising:

a heating unit configured to heat the target substrate on the mounting table, wherein the target substrate is heated to a temperature of 350° C. to 500° C. by the heating unit during film formation.

7. The film forming apparatus of claim 5, wherein during film formation, the $TiCl_4$ gas, the $H_2$ gas and the Ar gas are injected from the gas injection member at flow rates of 1 ml/min (sccm) to 200 ml/min (sccm), 1 ml/min (sccm) to 10000 ml/min (sccm), and 100 ml/min (sccm) to 10000 ml/min (sccm), respectively.

8. The film forming apparatus of claim 4, further comprising:

an impedance control circuit provided in a transmission path connected to the mounting table, wherein energy of Ar ions is increased by decreasing an impedance of the transmission path seen from the plasma using the impedance control circuit to increase a current flowing from the plasma toward the substrate.

9. A gas injection member, which is provided to face a target substrate mounted on a mounting table in a processing chamber, for injecting a processing gas to the target substrate on the mounting table to form a film on the target substrate by the processing gas in a state where a plasma is generated between the mounting table and the gas injection member, the gas injection member comprising:

a gas injection surface which faces the mourning table and is formed in a concentric shape with a guide ring or recess for holding the target substrate, wherein the gas injection surface includes a gas injection hole forming region at a center and a peripheral region surrounding the gas injection hole forming region, and a plurality of gas injection holes formed only in the gas injection hole forming region, wherein the gas injection hole forming region is smaller than a region on the gas injection surface corresponding to the guide ring or the recess when seen from a top view perspective, wherein the gas injection hole forming region is concentric with the region corresponding to the guide ring or the recess and a diameter of the gas injection hole forming region is smaller than an inner diameter of the region corresponding to the guide ring or an outer diameter or the region corresponding to the recess, and wherein a ratio of the diameter of the gas injection hole forming region to the inner diameter of the region corresponding to the guide ring or the outer diameter of region corresponding to the recess is 66.6% to 93.4%.

10. The gas injection member of claim 9, a ratio of the diameter of the gas injection hole forming region to the diameter of the region corresponding to the guide ring or the recess is 73.3% to 86.7%.

* * * * *